US012803528B2

(12) United States Patent
Nakamura et al.

(10) Patent No.: US 12,803,528 B2
(45) Date of Patent: Nov. 17, 2026

(54) ACOUSTIC WAVE DEVICE INCLUDING A SCANDIUM-CONTAINING ALUMINUM NITRIDE FILM

(71) Applicant: Murata Manufacturing Co., Ltd., Nagaokakyo (JP)

(72) Inventors: Kentaro Nakamura, Nagaokakyo (JP); Tetsuya Kimura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 577 days.

(21) Appl. No.: 18/382,607

(22) Filed: Oct. 23, 2023

(65) Prior Publication Data

US 2024/0048123 A1 Feb. 8, 2024

Related U.S. Application Data

(63) Continuation of application No. PCT/JP2022/022299, filed on Jun. 1, 2022.

(30) Foreign Application Priority Data

Jun. 8, 2021 (JP) ................................ 2021-095985

(51) Int. Cl.
*H03H 9/25* (2006.01)
*H10N 30/853* (2023.01)

(52) U.S. Cl.
CPC ............ *H03H 9/25* (2013.01); *H10N 30/853* (2023.02)

(58) Field of Classification Search
CPC .. H03H 9/25; H03H 9/02133; H03H 9/02929; H03H 9/02015; H03H 2003/021; H10N 30/308; H10N 30/853
See application file for complete search history.

(56) References Cited

U.S. PATENT DOCUMENTS 6,855,996 B2 * 2/2005 Noguchi .................. H03H 3/02 257/419
7,795,788 B2 * 9/2010 Yokota ............... H03H 9/14541 333/194

(Continued)

FOREIGN PATENT DOCUMENTS

JP 2009010926 A 1/2009
JP 2011015148 A 1/2011

(Continued)

OTHER PUBLICATIONS

International Search Report in PCT/JP2022/022299, mailed Jul. 19, 2022, 3 pages.

(Continued)

*Primary Examiner* — Emily P Pham
(74) *Attorney, Agent, or Firm* — Keating & Bennett, LLP

(57) ABSTRACT

An acoustic wave device includes a scandium-containing aluminum nitride film (ScAlN film) and an electrode on the ScAlN film. When an average grain size is calculated for an area-weighted average grain size of grain sizes along minor axes obtained by elliptical approximation, the ScAlN film includes a fine grain group including fine grains with a grain size smaller than or equal to about one half of the average grain size of all crystal grains, the fine grain group being located between first and second crystal grains grown in a columnar shape and adjacent to each other or between first and second crystal grains that are different in crystal orientation. A number of crystal grains in the fine grain group is about 50% or more of a total number of crystal grains in the ScAlN film.

20 Claims, 10 Drawing Sheets

(56) References Cited

U.S. PATENT DOCUMENTS

| | | | |
|---|---|---|---|
| 10,332,958 | B2 * | 6/2019 | Yoshikawa ............. B32B 15/04 |
| 2008/0296529 | A1 | 12/2008 | Akiyama et al. |
| 2012/0107557 | A1 | 5/2012 | Akiyama et al. |
| 2015/0084719 | A1 | 3/2015 | Umeda |
| 2019/0363243 | A1 | 11/2019 | Tanaka et al. |

FOREIGN PATENT DOCUMENTS

| | | | |
|---|---|---|---|
| JP | 2019207910 | A | 12/2019 |
| JP | 2020092322 | A | 6/2020 |

OTHER PUBLICATIONS

Written Opinion in PCT/JP2022/022299, mailed Jul. 19, 2022, 3 pages.

* cited by examiner

ACOUSTIC WAVE DEVICE INCLUDING A SCANDIUM-CONTAINING ALUMINUM NITRIDE FILM

CROSS REFERENCE TO RELATED APPLICATIONS

This application claims the benefit of priority to Japanese Patent Application No. 2021-095985 filed on Jun. 8, 2021 and is a Continuation Application of PCT Application No. PCT/JP2022/022299 filed on Jun. 1, 2022. The entire contents of each application are hereby incorporated herein by reference.

BACKGROUND OF THE INVENTION

1. Field of the Invention

The present invention relates to an acoustic wave device including a scandium-containing aluminum nitride film.

2. Description of the Related Art

Acoustic wave devices known in the related art include, as a piezoelectric film, a scandium (Sc)-containing aluminum nitride (AlN) film, that is, a ScAlN film. For example, Unexamined Patent Application Publication No. 2009-010926 discloses a BAW (Bulk Acoustic Wave) device including a scandium-doped-aluminum nitride film. In the BAW device, electrodes for applying an AC electric field are disposed on the upper surface and the lower surface of the ScAlN film. The BAW device includes a cavity below the ScAlN film. US 2015/0084719 A1 also discloses a BAW device having a similar structure.

SUMMARY OF THE INVENTION

Acoustic wave devices in the related art including a Sc-doped-aluminum nitride film increase in piezoelectricity as the Sc concentration increases. However, the ScAlN film may be warped or peeled at high Sc concentration. The warping or peeling of the ScAlN film may degrade the characteristics of acoustic wave devices. In addition, piezoelectricity may be deteriorated.

Preferred embodiments of the present invention provide acoustic wave devices each including a scandium-containing aluminum nitride film, wherein film warping or peeling and deterioration of piezoelectricity are reduced or prevented.

An acoustic wave device according to a preferred embodiment of the present invention includes a scandium-containing aluminum nitride film, and an electrode on the scandium-containing aluminum nitride film, wherein when an average grain size is calculated for an area-weighted average grain size of grain sizes along minor axes obtained by elliptical approximation, the scandium-containing aluminum nitride film includes a fine grain group including fine grains with a size smaller than or equal to one half of the average grain size of all crystal grains, the fine grain group being located between a crystal grain and a crystal grain that are grown in a columnar shape and adjacent to each other or between a crystal grain and a crystal grain that are different in crystal orientation, and a number of crystal grains in the fine grain group is about 50% or more of a total number of crystal grains in the scandium-containing aluminum nitride film.

Preferred embodiments of the present invention provide acoustic wave devices each including a scandium-containing aluminum nitride film, wherein film warping or peeling and deterioration of piezoelectricity are reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be clarified below by describing specific preferred embodiments of the present invention with reference to the drawings.

It should be understood that the preferred embodiments in this description are illustrative only, and partial replacements or combinations of configurations can be made between different preferred embodiments.

Figure 1A:
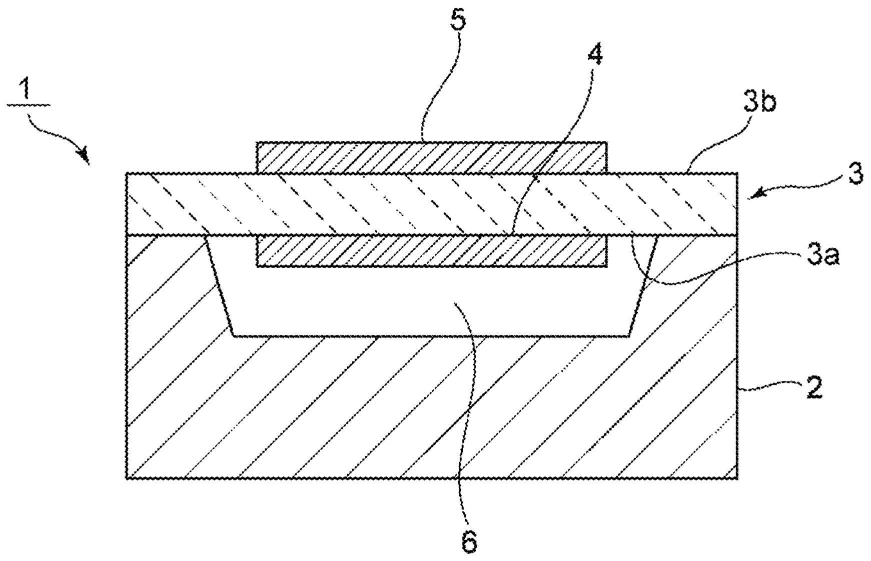
FIGS. 1A and 1B are an elevational cross-sectional view and a plan view of an acoustic wave device according to a first preferred embodiment of the present invention.
Figure 1B:
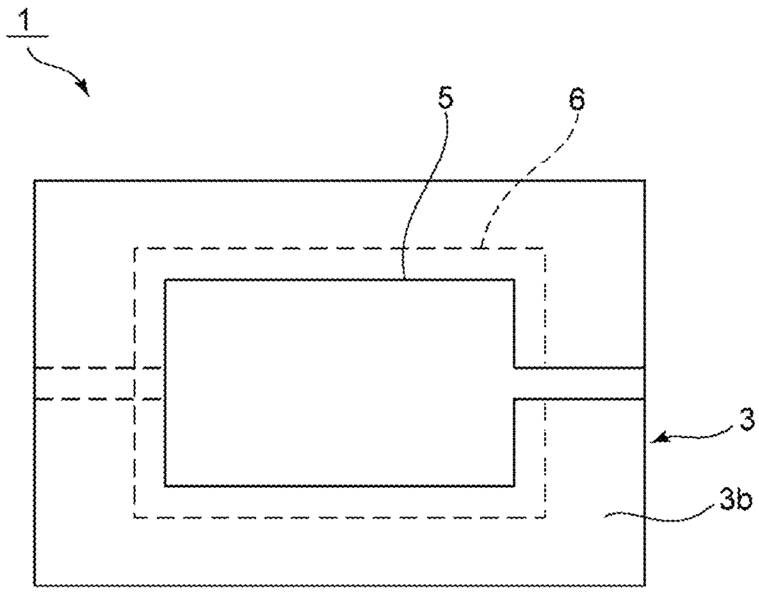

FIG. 1A is an elevational cross-sectional view of an acoustic wave device according to a first preferred embodiment of the present invention, and FIG. 1B is a plan view of the acoustic wave device.

An acoustic wave device 1 includes a support substrate 2. The support substrate 2 includes a recess on its upper surface. A scandium-containing aluminum nitride (ScAlN) film 3 is stacked so as to cover the recess on the upper surface of the support substrate 2. The ScAlN film 3 includes a first main surface 3*a* and a second main surface 3*b* opposite to the first main surface 3*a*. The first main surface 3*a* is stacked on the upper surface of the support substrate 2. This defines a cavity 6.

The acoustic wave device 1 includes an upper electrode 5 and a lower electrode 4 as electrodes. The lower electrode 4 is disposed on the first main surface 3*a*. The upper electrode 5 is disposed on the second main surface 3*b*. The upper electrode 5 and the lower electrode 4 overlap each other with the ScAlN film 3 interposed therebetween. This overlap region is an excitation region. Application of an AC electric field between the upper electrode 5 and the lower electrode 4 excites BAWs (bulk acoustic waves), which are acoustic waves. The acoustic wave device 1 is a BAW device having the ScAlN film 3 as a piezoelectric film, wherein the acoustic waves propagating through the ScAlN film 3 are mainly BAWs.

The cavity 6 is provided to prevent inhibition of BAW excitation in the ScAlN film 3. The cavity 6 is therefore positioned below the excitation region.

The support substrate 2 is made of an appropriate insulator or semiconductor. Examples of such materials include silicon, glass, GaAs, ceramics, and crystal. In this preferred embodiment, the support substrate 2 is a silicon substrate with high resistance.

The upper electrode 5 and the lower electrode 4 are made of an appropriate metal or alloy. Examples of such materials include metals, such as Ti, Mo, Ru, W, Al, Pt, Ir, Cu, Cr, and Sc, and alloys including these metals. The upper electrode 5 and the lower electrode 4 may each include a multilayer body including two or more metal films.

The ScAlN film 3 can be formed by an appropriate method, such as sputtering or CVD. In this preferred embodiment, the ScAlN film 3 is deposited by using an RF magnetron sputtering apparatus.

In the sputtering, a first target made of Al and a second target made of Sc are used to perform sputtering in a nitrogen gas atmosphere. In other words, the ScAlN film is formed by binary sputtering. In this case, the degree of orientation of the ScAlN film can be controlled by adjusting the sputtering conditions. The sputtering conditions may be, for example, the RF power magnitude, the gas pressure, the gas flow rate, and the target material composition or purity.

The orientation of the deposited ScAlN film can be determined by using ASTAR (registered trademark). ASTAR uses the ACOM-TEM method (Automated Crystal Orientation Mapping-TEM method).

Figure 2:
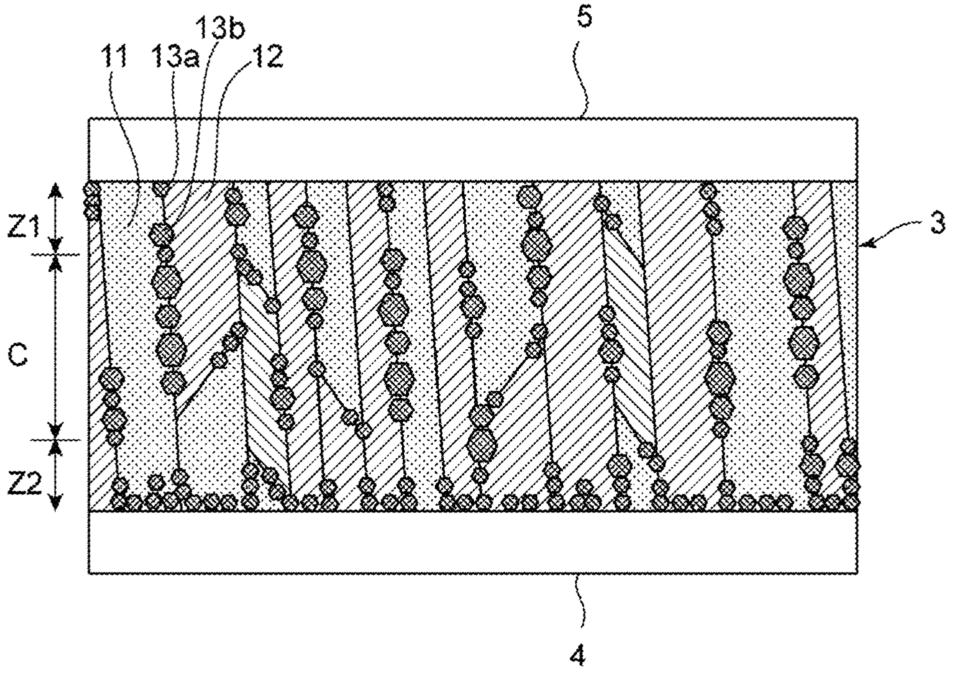
FIG. 2 is a schematic elevational cross-sectional view showing the distribution of the crystal orientation in a ScAlN film of the acoustic wave device according to the first preferred embodiment of the present invention.

FIG. 2 is a schematic elevational cross-sectional view showing the distribution of the crystal orientation in the ScAlN film 3 in the acoustic wave device according to the first preferred embodiment of the present invention.

The ScAlN film 3, a crystal grain 11 indicated by dot hatching, and a crystal grain 12 indicated by parallel hatching are grown in the film thickness direction. Fine grains 13*a* and 13*b* are present at crystal grain boundaries. The grain boundary refers to a boundary between a crystal grain and a crystal grain or between a crystal grain and a crystal grain that are different in crystal orientation. One of the unique features of the acoustic wave device 1 of this preferred embodiment is the presence of the fine grains 13*a* and 13*b*. This configuration reduces stress in the ScAlN film 3 so that the ScAlN film 3 is less likely to warp or peel. In addition, piezoelectricity is less likely to deteriorate. This feature will be described below by using Examples 1 to 3 of the first preferred embodiment as examples.

Example 1: Sc Concentration in ScAlN Film 3: About 6.8 Atom %

Figure 3:
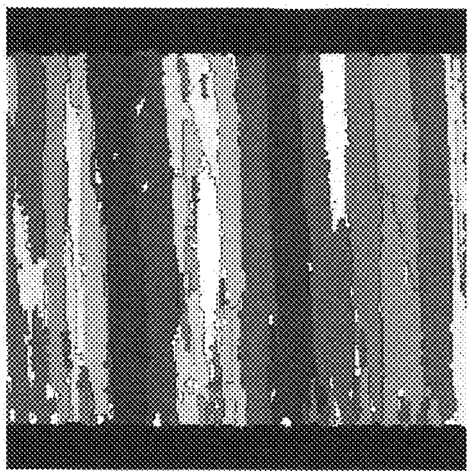
FIG. 3 is a micrograph of an inverse pole figure map showing the distribution of the crystal orientation in the ScAlN film in Example 1.
Figure 4:
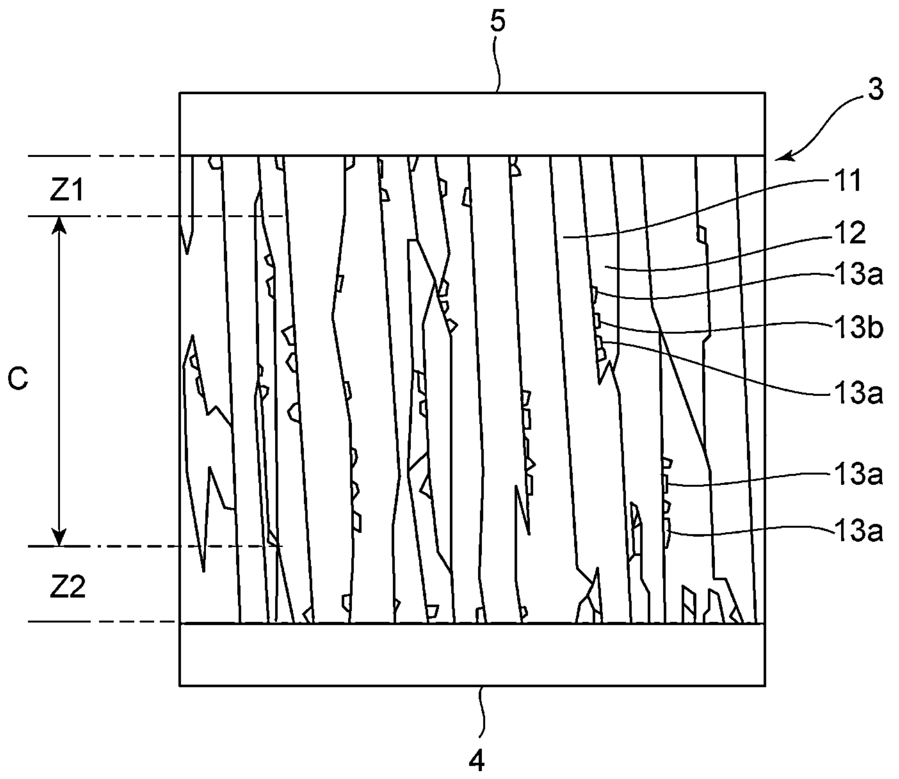
FIG. 4 is a schematic elevational cross-sectional view for describing the distribution of crystal grains in the inverse pole figure map shown in FIG. 3.
Figure 7:
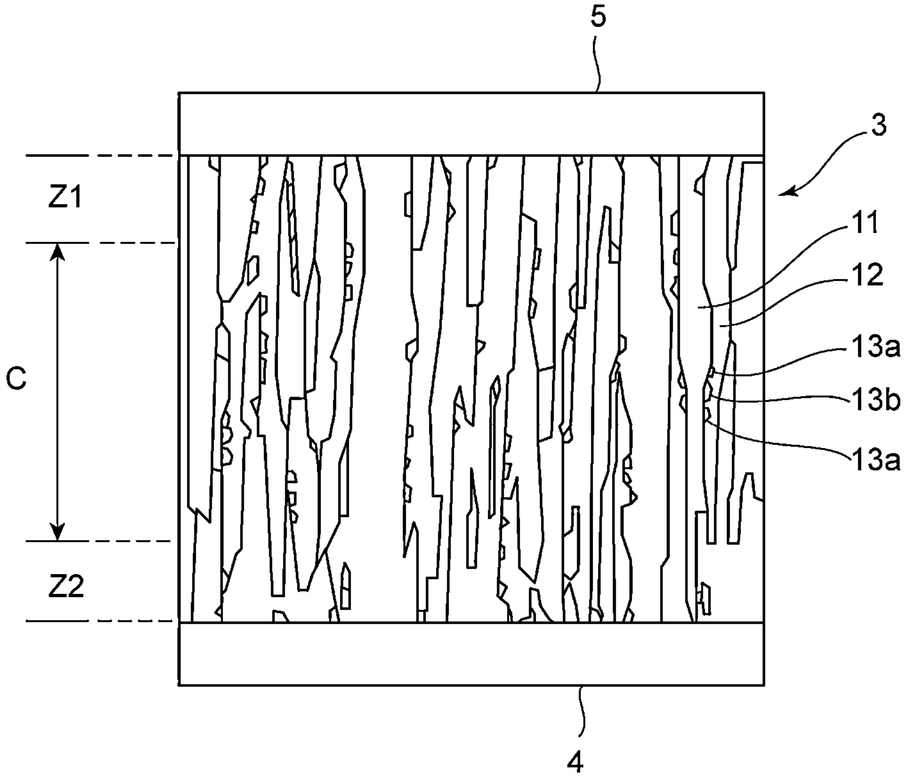
FIG. 7 is a schematic elevational cross-sectional view for describing the distribution of crystal grains in the inverse pole figure map shown in FIG. 6.
Figure 10:
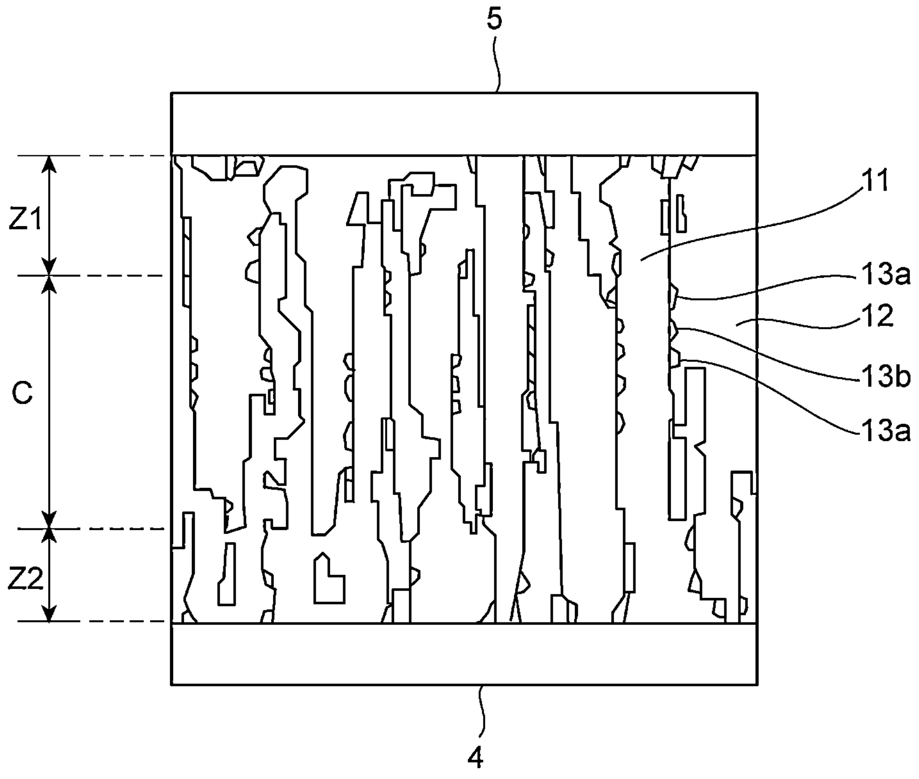
FIG. 10 is a schematic elevational cross-sectional view for describing the distribution of crystal grains in the inverse pole figure map shown in FIG. 9.

FIG. 3 is a micrograph of an inverse pole figure map showing the distribution of the crystal orientation in the ScAlN film 3 in Example 1. This is measured by using ASTAR (registered trademark) described above. FIG. 4 is a schematic elevational cross-sectional view showing the distribution of crystal grains in the inverse pole figure map shown in FIG. 3. In FIG. 4 and FIGS. 7 and 10 described below, hatching indicating the cross section is omitted to clarify the shape of the grains. FIG. 4 illustrates crystal grains different in crystal orientation in the inverse pole figure map shown in FIG. 3, and grain boundaries, which are boundaries between the crystal grains. As apparent from FIG. 4, for example, the fine grains 13*a* and 13*b* described above are present at grain boundaries between the crystal grain 11 and the crystal grain 12.

The fine grains refer to grains having a grain size smaller than or equal to one half of the average grain size of all of the crystal grains. The grain size is the minor axis of a grain size obtained by elliptical approximation in the micrograph of the inverse pole figure map measured by using ASTAR (registered trademark). The average grain size of all of the crystal grains is the area-weighted average grain size. The fine grains are located at a grain boundary between a crystal grain and a crystal grain that are grown in a columnar shape and adjacent to each other or between a crystal grain and a crystal grain that are different in crystal orientation.

Figure 16:
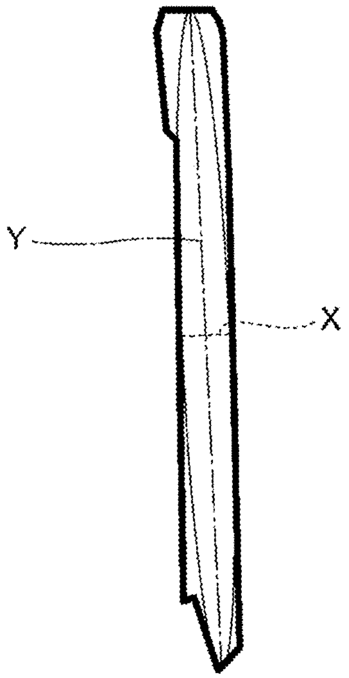
FIG. 16 is a schematic view for describing the crystal grain size in preferred embodiments of the present invention.

FIG. 16 is a schematic view for describing the crystal grain size in preferred embodiments of the present invention.

In preferred embodiments of the present invention, the crystal grain size refers to the dimension indicated by the dashed line in FIG. 16. More specifically, the crystal grain size is the minor axis X among the major axis Y and the minor axis X obtained by elliptical approximation of a crystal grain in the inverse pole figure orientation map. Elliptical approximation is carried out, for example, as described below. Multiple vectors pointing toward the grain boundary from the center of gravity of the crystal grain are obtained. Next, a vector is obtained as a weighted average of the multiple vectors weighted according to the magnitude of the multiple vectors. The direction of the weighted-average vector is defined as the major axis direction, and the direction perpendicular to the major axis direction is defined as the minor axis direction.

The major axis direction of a crystal grain obtained by elliptical approximation is substantially parallel to the growth direction of the crystal grain. The major axis Y of crystal grains tends to depend on the thickness of the ScAlN film 3. The minor axis X is thus focused on and used as a crystal grain size in preferred embodiments of the present invention.

In each region, the average value of the crystal grain size is defined as an average grain size. In each region, the area-weighted average value of the crystal grain size is defined as an area-weighted average grain size. To calculate the area-weighted average value of the crystal grain size, the grain size of each crystal grain is weighted according to the area of each crystal grain in the inverse pole figure orientation map. Specifically, the area-weighted average grain size is calculated by dividing the sum of the products of the crystal grain size and the crystal grain area by the total crystal grain area.

Figure 5:
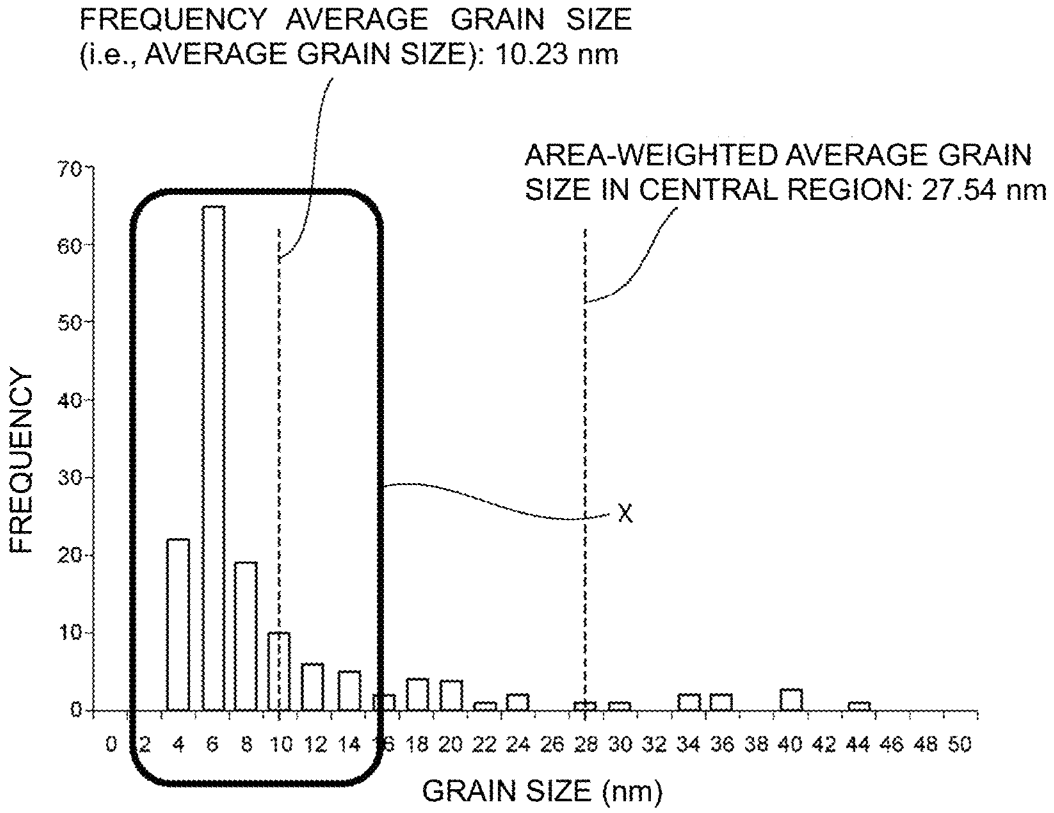
FIG. 5 is a figure showing the grain size distribution of the crystal grains in Example 1.

FIG. 5 is a distribution graph showing the grain size of the crystal grains in the ScAlN film 3 in Example 1 above. As apparent from FIG. 5, a large number of crystal grains with small grain sizes are present. In FIG. 5, the frequency average grain size, that is, the average grain size, is about 10.23 nm, for example.

Referring to FIG. 4, a central region of the ScAlN film 3 in the thickness direction is defined as a central region C. A region Z1 adjacent to the upper electrode 5 and a region Z2 adjacent to the lower electrode 4 are located on both sides of the central region C. The region Z1 adjacent to the upper electrode 5 and a region Z2 adjacent to the lower electrode 4 each have a thickness of about 10% or more and about 25% or less of the film thickness of the ScAlN film 3, for example.

The area-weighted average grain size of the grain size in the central region C of the ScAlN film 3 in the thickness direction is about 27.54 nm, for example. Therefore, the grain size smaller than or equal to one half of the area-weighted average grain size=27.54 nm is about 13.77 nm or less, for example. The crystal grains with a grain size of about 13.77 nm or less are fine grains in Example 1. As apparent from FIG. 5, a large number of the fine grains are present in the ScAlN film 3 in Example 1. In other words, a fine grain group is present. The number of crystal grains in the fine grain group is about 50% or more of the total number of crystal grains in the ScAlN film 3, for example. This configuration can distribute the stress between the crystal grains. Therefore, the ScAlN film 3 is less likely to warp or peel, and the characteristics are less likely to degrade. In addition, the crystal that constitutes the ScAlN film 3 has less defects, which results in high piezoelectricity.

The presence of the fine grains 13*a* and 13*b* at the crystal grain boundaries is achieved by adjusting the conditions of the deposition process, as described above. For example, the fine grains 13*a* and 13*b* can be present when the sputtering gas flow path is adjusted in terms of the composition of the sputtering gas, the sputtering temperature and time, and other conditions.

As shown in Example 1, the presence of the fine grains 13*a* and 13*b* in the acoustic wave device 1 reduces stress in the film so that warping or peeling and deterioration of piezoelectricity are reduced or prevented.

Furthermore, the ScAlN film 3 is highly oriented in the c-axis direction. The c-axis direction is the film thickness direction of the ScAlN film 3. Since high orientation can be maintained, good acoustic characteristics are obtained. Therefore, for example, a filter including the acoustic wave device 1 enables lower loss.

The concentration of scandium in the ScAlN film 3 is preferably about 2 atom % or more and about 20 atom % or less, for example. When the concentration of scandium is about 2 atom % or more, for example, the orientation distribution as described above can be achieved more assuredly. If the concentration of scandium is more than about 20 atom %, for example, the stress in the film is so large that it is difficult to prevent or reduce warping or peeling.

In the ScAlN film 3, the average grain size of the fine grains is represented by Ra, and the area-weighted average grain size along the minor axes obtained by elliptical approximation is represented by Rb. More preferably, Rb is about 1.91 or more when Ra is 1, for example. In this case, the warping or peeling of the ScAlN film 3 can be prevented or reduced more effectively.

In the grain size frequency distribution at 2 nm intervals, the total frequency Da in the range of Ra±40% is preferably 2 or more when the total frequency db in the range of Rb±40% is 1, for example.

In the grain size frequency distribution at 2 nm intervals, the total frequency Ea in the range including Ra±2 nm is preferably 3 or more when the total frequency Eb in the range including Rb±2 nm is 1. In this case, the ScAlN film 3 has good piezoelectricity, and the acoustic wave device has good piezoelectricity.

More preferably, the area-weighted average grain size Rb along the minor axes obtained by elliptical approximation of the crystal grain size in the ScAlN film 3 is about 30 nm or less, for example. In this case, the strain and stress in the ScAlN film 3 can be further reduced.

Example 2: Sc Concentration in ScAlN Film 3: About 11.7 Atom %

Figure 6:
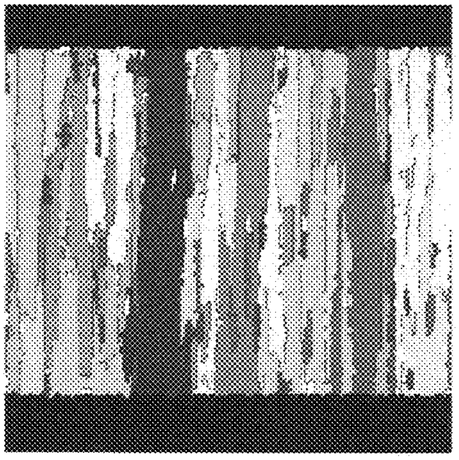
FIG. 6 is a micrograph of an inverse pole figure map showing the distribution of the crystal orientation in the ScAlN film in Example 2.

FIG. 6 is a micrograph of an inverse pole figure map showing the distribution of the crystal orientation in the ScAlN film 3 in Example 2. This is measured by using ASTAR (registered trademark) described above. FIG. 7 is a schematic elevational cross-sectional view showing the distribution of crystal grains in the inverse pole figure map shown in FIG. 6. FIG. 7 illustrates crystal grains different in crystal orientation in the inverse pole figure map shown in FIG. 6, and grain boundaries, which are boundaries between the crystal grains. As apparent from FIG. 7, the fine grains 13*a* and 13*b* described above are present at grain boundaries between the crystal grain 11 and the crystal grain 12.

Figure 8:
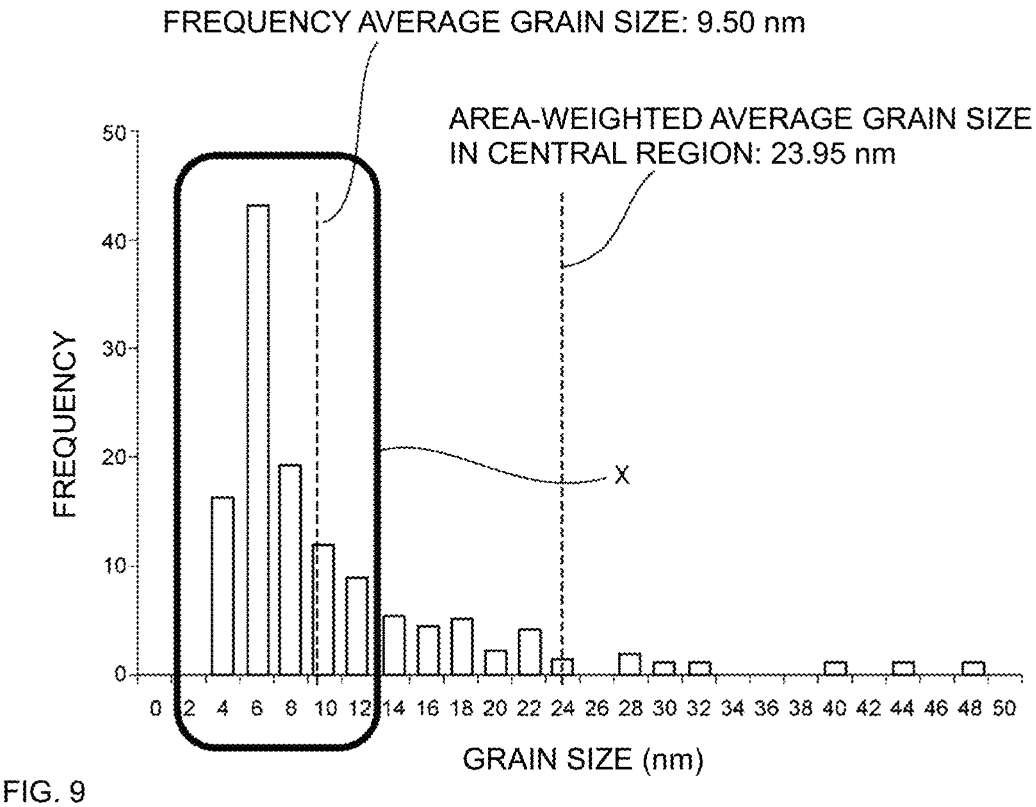
FIG. 8 is a figure showing the grain size distribution of the crystal grains in Example 2.

FIG. 8 is a graph showing the grain size distribution of crystal grains in the ScAlN film 3 in Example 2 above. As apparent from FIG. 8, a large number of crystal grains with small grain sizes are also present in Example 2. In FIG. 8, the frequency average grain size, that is, the average grain size, is about 9.50 nm, for example. The area-weighted average grain size of the grain size in the central region C of the ScAlN film 3 in the thickness direction is about 23.95 nm, for example. Therefore, the fine grains are crystal grains having a grain size of about 11.98 nm or less, for example. It is thus confirmed that a large number of fine grains are present along the crystal grain boundaries in the central region C.

In Example 2, the presence of the fine grains in the acoustic wave device 1 also reduces stress in the film so that film warping or peeling and deterioration of piezoelectricity are reduced or prevented.

Example 3: Sc Concentration in ScAlN Film 3: About 26.6 Atom %

Figure 9:
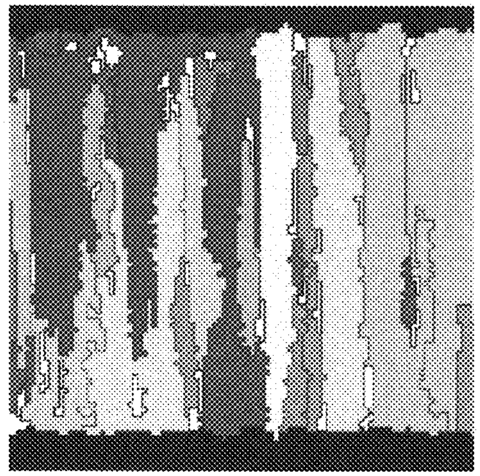
FIG. 9 is a micrograph of an inverse pole figure map showing the distribution of the crystal orientation in the ScAlN film in Example 3.

FIG. 9 is a micrograph of an inverse pole figure map showing the distribution of the crystal orientation in the ScAlN film 3 in Example 3. This is measured by using ASTAR (registered trademark) described above. FIG. 10 is a schematic elevational cross-sectional view showing the distribution of crystal grains in the inverse pole figure map shown in FIG. 9. FIG. 10 illustrates crystal grains different in crystal orientation in the inverse pole figure map shown in FIG. 9, and grain boundaries, which are boundaries between the crystal grains. As apparent from FIG. 10, the fine grains 13*a* and 13*b* described above are present at grain boundaries between the crystal grain 11 and the crystal grain 12.

Figure 11:
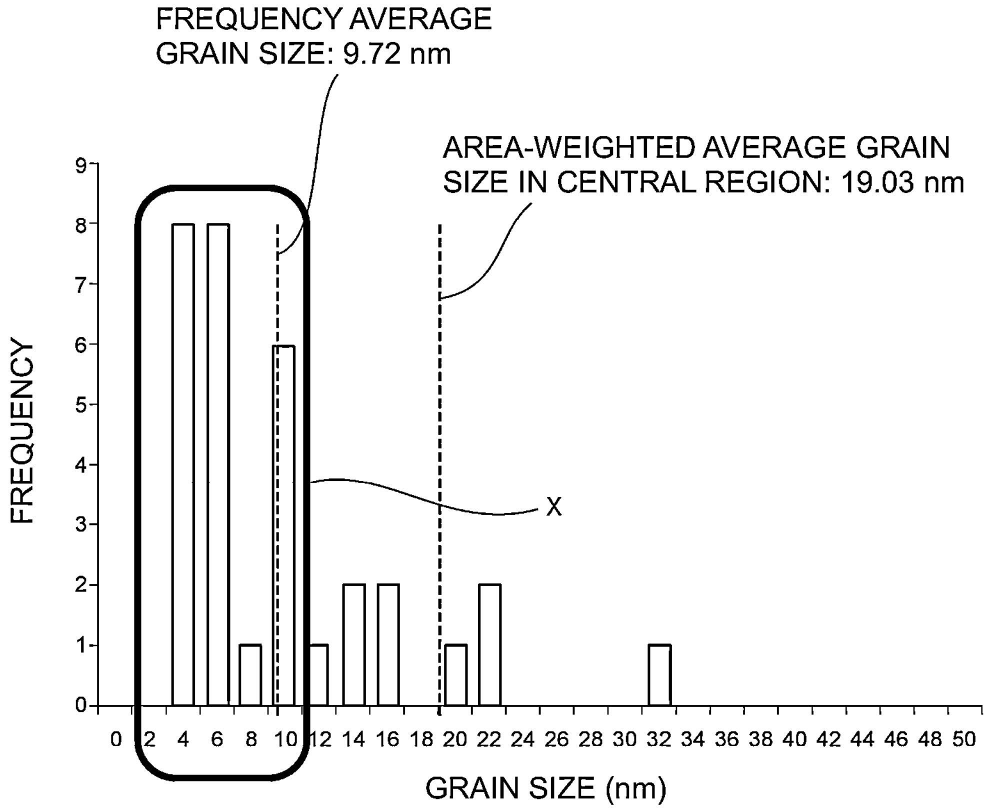
FIG. 11 is a figure showing the grain size distribution of the crystal grains in Example 3.

FIG. 11 is a distribution graph showing the grain size of the crystal grains in the ScAlN film in Example 3 above. As apparent from FIG. 11, a large number of crystal grains with small grain sizes are present. In FIG. 11, the frequency average grain size, that is, the average grain size, is about 9.72 nm, for example. The area-weighted average grain size of the grain size in the central region C of the ScAlN film 3 in the thickness direction is about 19.03 nm, for example. Therefore, the fine grains have a grain size of about 9.52 nm or less, for example. As apparent from FIG. 11, a large number of fine grains are present along the crystal grain boundaries in the central region C.

In Example 3, the presence of the fine grains also reduces stress in the film so that warping or peeling is reduced or prevented. In addition, deterioration of piezoelectricity is reduced or prevented.

Figure 12:
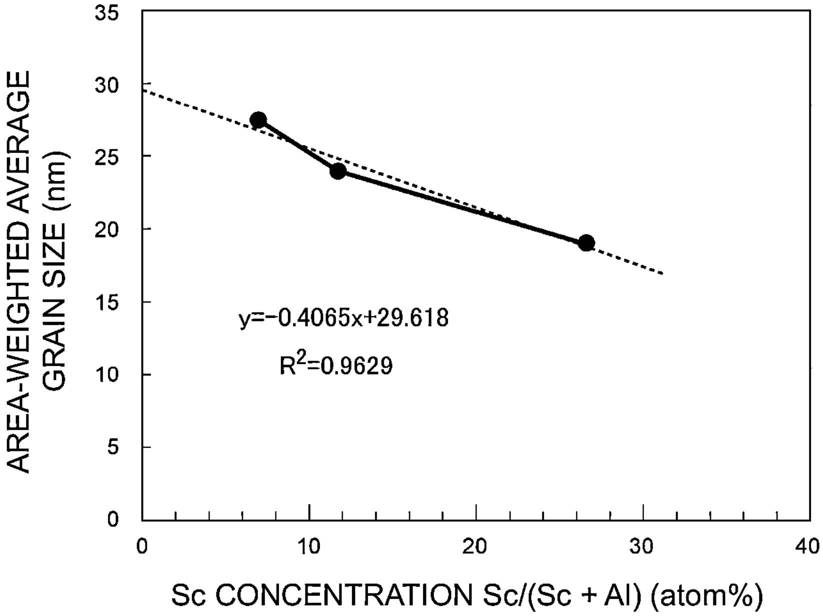
FIG. 12 is a figure illustrating the relationship between the Sc concentration and the area-weighted average grain size.

FIG. 12 is a figure illustrating the relationship between the Sc concentration Sc/(Sc+Al) (atom %) in the ScAlN film 3 and the area-weighted average grain size of the minor axes obtained by elliptical approximation. The area-weighted average grain size is the area-weighted average grain size in the central region C described above. As the Sc concentration approaches 0, the area-weighted average grain size approaches about 30 nm, for example. As the Sc concentration increases, the area-weighted average grain size decreases below 30 nm. The stress due to the film, that is, the strain between a crystal grain and a crystal grain, can thus decrease as the area-weighted average grain size decreases. Thus, the area-weighted average grain size is preferably about 30 nm or less, for example.

Figure 13:
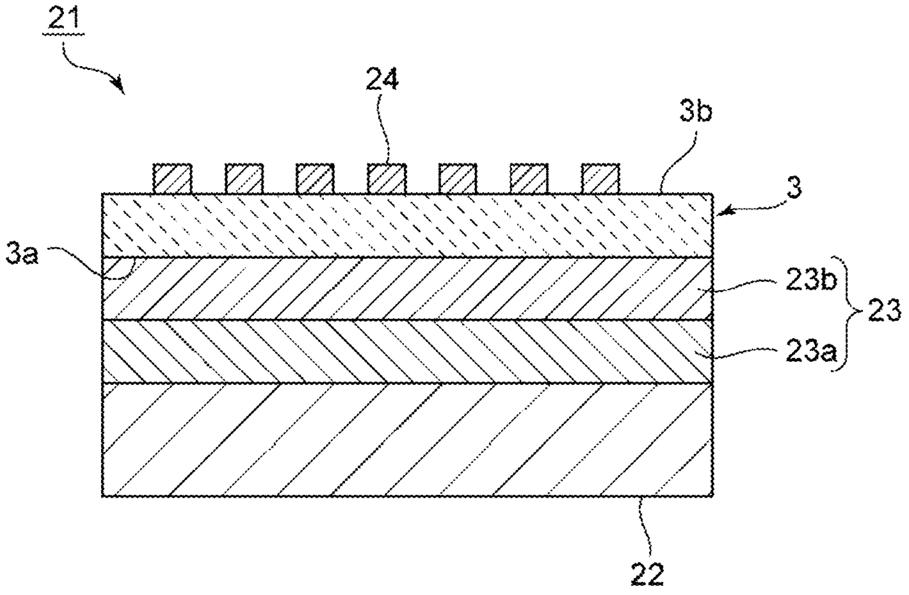
FIG. 13 is an elevational cross-sectional view of an acoustic wave device according to a second preferred embodiment of the present invention.

FIG. 13 is an elevational cross-sectional view of an acoustic wave device according to a second preferred embodiment of the present invention. In the acoustic wave device 21, a ScAlN film 3 is stacked on a support substrate 22 with an intermediate layer 23 interposed therebetween. In the intermediate layer 23, a second dielectric layer 23*b* is stacked on a first dielectric layer 23*a*. In this preferred embodiment, the first dielectric layer 23*a* is made of silicon nitride. The second dielectric layer 23*b* is made of silicon oxide. An IDT electrode 24 is disposed as an electrode on the ScAlN film 3. The acoustic wave device 21 of this preferred embodiment is a surface acoustic wave device including the IDT electrode 24. As described above, the electrode in contact with the ScAlN film 3 may be the IDT electrode 24 in a preferred embodiment of the present invention. Surface acoustic waves propagating through the ScAlN film 3 may be used by applying an AC voltage from the IDT electrode 24.

The IDT electrode 24 may be made of the same material as the upper electrode 5 and the lower electrode 4 as described above.

The first dielectric layer 23*a* and the second dielectric layer 23*b* of the intermediate layer 23 may be made of various dielectric materials, such as alumina and silicon oxynitride as well as silicon nitride and silicon oxide.

The support substrate 22 may be made of the same material as the support substrate 2 in the first preferred embodiment.

In the acoustic wave device 21, the ScAlN film 3 also has the same crystal orientation as in the first preferred embodiment. In other words, the ScAlN film 3 includes the fine grains 13*a* and 13*b* described above at the crystal grain boundaries. In the acoustic wave device 21, film warping or peeling and deterioration of piezoelectricity are reduced or prevented.

By the way, the first dielectric layer 23*a* in this preferred embodiment is a high acoustic velocity film defining and functioning as a high acoustic velocity material layer. The high acoustic velocity material layer is a relatively high acoustic velocity layer. More specifically, the acoustic velocity of a bulk wave propagating through the high acoustic velocity material layer is higher than the acoustic velocity of an acoustic wave propagating through the ScAlN film 3. The second dielectric layer 23*b* is a low acoustic velocity film. The low acoustic velocity film is a relatively low acoustic velocity film. More specifically, the acoustic velocity of a bulk wave propagating through the low acoustic velocity film is lower than the acoustic velocity of a bulk wave propagating through the ScAlN film 3. When the high acoustic velocity film defining and functioning as a high acoustic velocity material layer, the low acoustic velocity film, and the ScAlN film 3 are stacked in this order, the acoustic wave energy can be effectively confined on the ScAlN film 3 side.

The intermediate layer may be a low acoustic velocity film. In this case, the support substrate 22 is preferably a high acoustic velocity support substrate defining and functioning as a high acoustic velocity material layer. When the high acoustic velocity support substrate defining and functioning as a high acoustic velocity material layer, the low acoustic velocity film, and the ScAlN film 3 are stacked in this order, the acoustic wave energy can be effectively confined on the ScAlN film 3 side.

The intermediate layer may be a high acoustic velocity film. When the high acoustic velocity film defining and functioning as a high acoustic velocity material layer, and the ScAlN film 3 are stacked, the acoustic wave energy can be effectively confined on the ScAlN film 3 side.

In the absence of the intermediate layer, the support substrate 22 is preferably a high acoustic velocity support substrate. When the high acoustic velocity support substrate and the ScAlN film 3 are stacked, the acoustic wave energy can be effectively confined on the ScAlN film 3 side.

Examples of the material of the high acoustic velocity material layer include various materials, such as aluminum oxide, silicon carbide, silicon nitride, silicon oxynitride, silicon, sapphire, lithium tantalate, lithium niobate, crystal, alumina, zirconia, cordierite, mullite, steatite, forsterite, magnesia, a DLC (diamond-like carbon) film, and diamond; a medium including the above material as a main component; and a medium including a mixture of the above materials as a main component.

Examples of the material of the low acoustic velocity film include various materials, such as silicon oxide, glass, silicon oxynitride, tantalum oxide, and a compound formed by adding fluorine, carbon, boron, hydrogen, or a silanol group to silicon oxide, and a medium including the above material as a main component.

Figure 14:
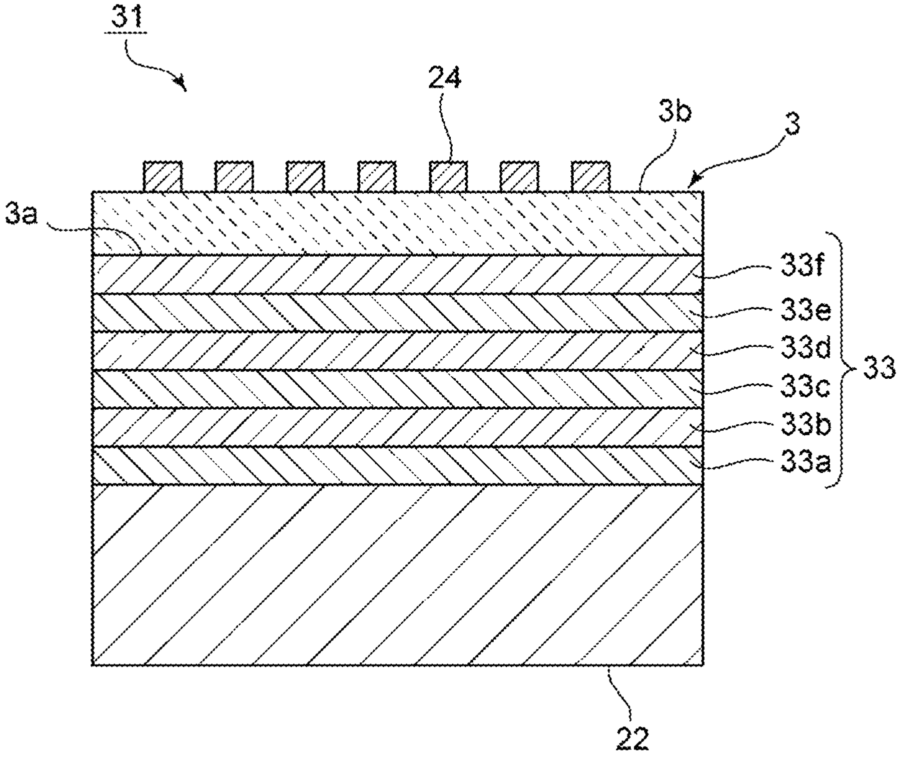
FIG. 14 is an elevational cross-sectional view of an acoustic wave device according to a third preferred embodiment of the present invention.

FIG. 14 is an elevational cross-sectional view of an acoustic wave device according to a third preferred embodiment of the present invention.

In an acoustic wave device 31, an intermediate layer 33 includes acoustic reflection layers. Specifically, the intermediate layer 33 includes a multilayer body including high acoustic impedance layers 33*a*, 33*c*, and 33*e* with a relatively high acoustic impedance, and low acoustic impedance layers 33*b*, 33*d*, and 33*f* with a relatively low acoustic impedance. The acoustic wave device 31 has the same structure as the acoustic wave device 21 except that the intermediate layer 33 has the above structure.

In a preferred embodiment of the present invention, the intermediate layer may include these acoustic reflection layers. In the acoustic wave device 31, the ScAlN film 3 also has the same crystal grain distribution as in the first preferred embodiment. In other words, the ScAlN film 3 includes the fine grains described above at the crystal grain boundaries. Therefore, film warping or peeling and deterioration of piezoelectricity are reduced or prevented.

Examples of the material of the high acoustic impedance layers 33*a*, 33*c*, and 33*e* include metals, such as platinum and tungsten, and dielectrics, such as aluminum nitride and silicon nitride. Examples of the material of the low acoustic impedance layers 33*b*, 33*d*, and 33*f* include silicon oxide and aluminum.

Figure 15:
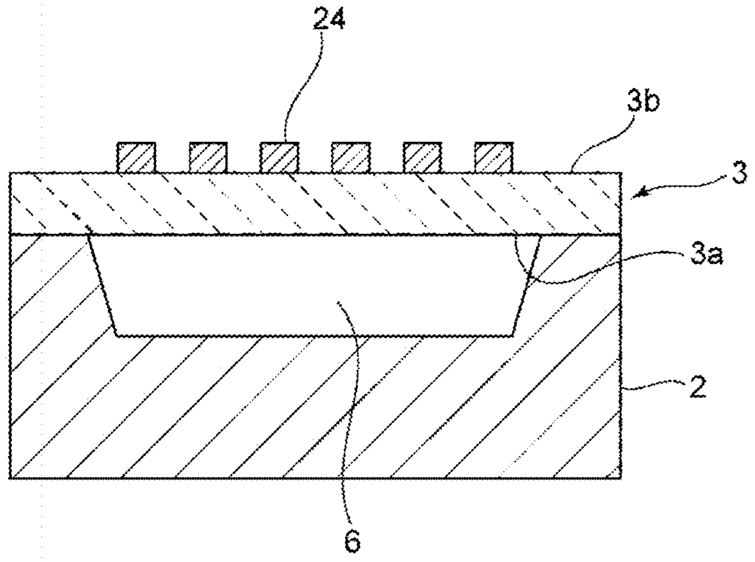
FIG. 15 is an elevational cross-sectional view of an acoustic wave device according to a fourth preferred embodiment of the present invention.

FIG. 15 is an elevational cross-sectional view of an acoustic wave device according to a fourth preferred embodiment of the present invention.

This preferred embodiment differs from the first preferred embodiment in that the electrode on the ScAlN film 3 is an IDT electrode 24. The IDT electrode 24 is disposed on the second main surface 3*b* of the ScAlN film 3. There is no electrode in a region on the first main surface 3*a* that faces the IDT electrode 24. Otherwise, the acoustic wave device of this preferred embodiment has the same structure as the acoustic wave device 1 of the first preferred embodiment.

In plan view, at least a portion of the IDT electrode 24 overlaps the cavity 6. The plan view refers to a view from above in FIG. 15.

The acoustic wave device according to this preferred embodiment is a surface acoustic wave device including the ScAlN film 3 as a piezoelectric film, wherein the acoustic waves propagating through the ScAlN film 3 are mainly plate waves. In this preferred embodiment, the ScAlN film 3 also has the same crystal grain distribution as in the first preferred embodiment. Therefore, film warping or peeling and deterioration of piezoelectricity are reduced or prevented.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:

a scandium-containing aluminum nitride film; and an electrode on the scandium-containing aluminum nitride film; wherein when an average grain size is calculated for an area-weighted average grain size of grain sizes along minor axes obtained by elliptical approximation, the scandium-containing aluminum nitride film includes a fine grain group including fine grains with a size smaller than or equal to about one half of the average grain size of all crystal grains, the fine grain group being located between a crystal grain and a crystal grain that are grown in a columnar shape and adjacent to each other or between a crystal grain and a crystal grain that are different in crystal orientation, and a number of crystal grains in the fine grain group is about 50% or more of a total number of crystal grains in the scandium-containing aluminum nitride film.

2. The acoustic wave device according to claim 1, wherein, when the average grain size of grain sizes along the minor axes obtained by the elliptical approximation is represented by Ra, and the area-weighted average grain size along the minor axes obtained by the elliptical approximation is represented by Rb, in a grain size frequency distribution at 2 nm intervals, a total frequency Da in a range of Ra±40% is 2 or more when a total frequency db in a range of Rb±40% is 1.

3. The acoustic wave device according to claim 1, wherein when the average grain size of grain sizes along the minor axes obtained by the elliptical approximation is represented by Ra, and the area-weighted average grain size along the minor axes obtained by the elliptical approximation is represented by Rb, in a grain size frequency distribution at 2 nm intervals, a total frequency Ea in a range including Ra±2 nm is 3 or more when a total frequency Eb in a range including Rb±2 nm is 1.

4. The acoustic wave device according to claim 2, wherein Rb is about 1.91 or more when Ra is 1.

5. The acoustic wave device according to claim 1, wherein the area-weighted average grain size Rb along the minor axes obtained by the elliptical approximation of the crystal grain size of the scandium-containing aluminum nitride film is about 30 nm or less.

6. The acoustic wave device according to claim 1, wherein the electrode includes a lower electrode on a first main surface of the scandium-containing aluminum nitride film and an upper electrode on a second main surface.

7. The acoustic wave device according to claim 6, wherein the upper electrode and the lower electrode are structured to generate a bulk acoustic wave.

8. The acoustic wave device according to claim 1, wherein the electrode is an IDT electrode.

9. The acoustic wave device according to claim 6, further comprising a support substrate on a first main surface side of the scandium-containing aluminum nitride film, wherein a cavity is between the support substrate and the scandium-containing aluminum nitride film.

10. The acoustic wave device according to claim 6, further comprising:

a support substrate on a first main surface side of the scandium-containing aluminum nitride film; and an intermediate layer between the support substrate and the first main surface of the scandium-containing aluminum nitride film.

11. The acoustic wave device according to claim 10, wherein the intermediate layer is an acoustic reflection layer.

12. The acoustic wave device according to claim 11, wherein the acoustic reflection layer includes a high acoustic impedance layer with a relatively high acoustic impedance and a low acoustic impedance layer with a relatively low acoustic impedance.

13. The acoustic wave device according to claim 8, further comprising:

a high acoustic velocity material layer on a first main surface side of the scandium-containing aluminum nitride film;

wherein an acoustic velocity of a bulk wave propagating through the high acoustic velocity material layer is higher than an acoustic velocity of an acoustic wave propagating through the scandium-containing aluminum nitride film.

14. The acoustic wave device according to claim 13, further comprising:

a low acoustic velocity film between the high acoustic velocity material layer and the scandium-containing aluminum nitride film; wherein an acoustic velocity of a bulk wave propagating through the low acoustic velocity film is lower than an acoustic velocity of a bulk wave propagating through the scandium-containing aluminum nitride film.

15. The acoustic wave device according to claim 9, wherein the support substrate is made of an insulator or a semiconductor.

16. The acoustic wave device according to claim 10, wherein the support substrate is made of an insulator or a semiconductor.

17. The acoustic wave device according to claim 1, wherein a concentration of scandium in the scandium-containing aluminum nitride film is about 2 atom % or more and about 20 atom % of less.

18. The acoustic wave device according to claim 10, wherein the intermediate layer includes first and second dielectric layers.

19. The acoustic wave device according to claim 18, wherein the first dielectric layer is made of silicon nitride and the second dielectric layer is made of silicon oxide.

20. The acoustic wave device according to claim 10, wherein the intermediate layer is a low acoustic velocity film.

* * * * *